(12) United States Patent
Hu

(10) Patent No.: US 9,673,148 B2
(45) Date of Patent: Jun. 6, 2017

(54) SYSTEM IN PACKAGE

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 14/931,044

(22) Filed: Nov. 3, 2015

(65) Prior Publication Data

US 2017/0125347 A1   May 4, 2017

(51) Int. Cl.

| | |
|---|---|
| *H01L 23/48* | (2006.01) |
| *H01L 23/538* | (2006.01) |
| *H01L 23/31* | (2006.01) |
| *H01L 23/522* | (2006.01) |
| *H01L 21/56* | (2006.01) |
| *H01L 23/532* | (2006.01) |
| *H01L 25/16* | (2006.01) |
| *H01L 21/768* | (2006.01) |

(52) U.S. Cl.
CPC ........ *H01L 23/5386* (2013.01); *H01L 21/565* (2013.01); *H01L 21/768* (2013.01); *H01L 23/3114* (2013.01); *H01L 23/5226* (2013.01); *H01L 23/53242* (2013.01); *H01L 25/16* (2013.01)

(58) Field of Classification Search
CPC . H01L 24/19; H01L 23/5336; H01L 23/3114; H01L 23/5226; H01L 23/53242; H01L 25/16; H01L 21/768; H01L 21/565
USPC .................................................. 257/741, 784
See application file for complete search history.

(56) References Cited

U.S. PATENT DOCUMENTS

| | | | |
|---|---|---|---|
| 2006/0042834 A1* | 3/2006 | Lee ......................... | H01L 24/72 174/267 |
| 2013/0037950 A1* | 2/2013 | Yu ..................... | H01L 23/49816 257/738 |
| 2014/0091471 A1* | 4/2014 | Chen ...................... | H01L 24/19 257/770 |

* cited by examiner

*Primary Examiner* — Vongsavanh Sengdara
(74) *Attorney, Agent, or Firm* — Hauptman Ham, LLP

(57) ABSTRACT

An electronic system without using solder balls between electrical components, and without using interposer between chips and package substrate, without using a discrete system board for the chip package to mount. A chip is wrapped by molding material, a first redistribution circuitry is built on a bottom side of the molding material; a second redistribution circuitry is built on a bottom side of the first redistribution circuitry. A third redistribution circuitry is built on a bottom side of the second redistribution circuitry. Plated metal vias are configured between each two of the electrical components.

13 Claims, 5 Drawing Sheets

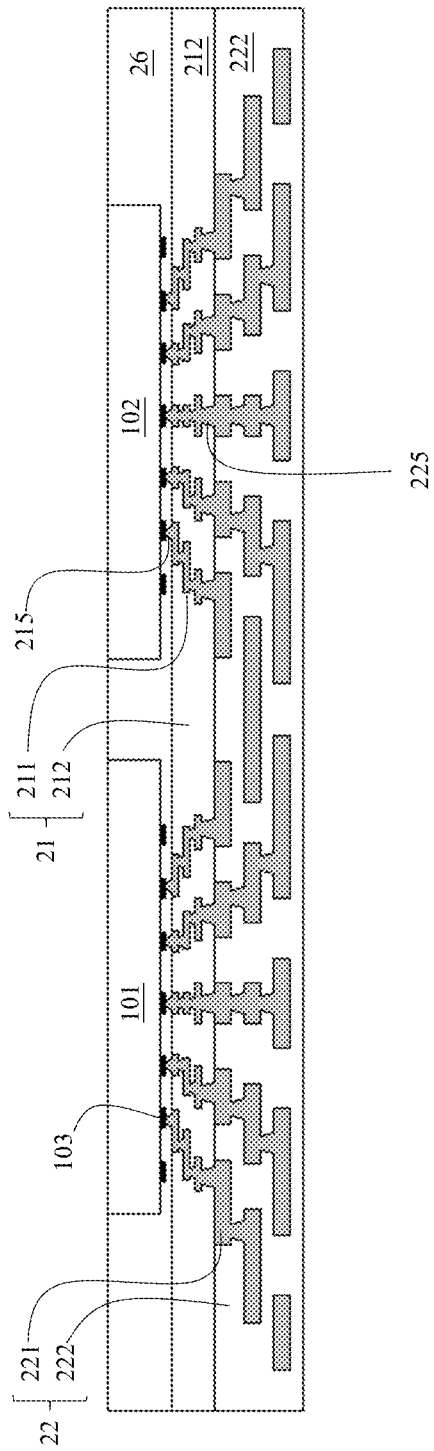

//SYSTEM IN PACKAGE

BACKGROUND

Technical Field

The present invention relates to an electrical package system; especially relates to a system in package (SiP) without using the following components: discrete solder balls, discrete interposer, discrete package substrate, underfill, and discrete system board.

Description of Related Art

FIG. 1 shows a prior art.

FIG. 1 shows chips 101, 102 configured on a top side of a traditional system in package. Three pluralities of solder balls 141, 142, 143 have been used to join each two components of the system. A first plurality of solder balls 141 join the chips 101, 102 to the silicon interposer 11. A second plurality of solder balls 142 join the silicon interposer 11 to the package substrate 12. A third plurality of solder balls 143 join the package substrate 12 to the system board 13.

Each of the chips 101, 102 has a plurality of I/O pads 103 configured on a bottom side of the chip. The silicon interposer 11 has a core silicon substrate 110. A plurality of conductive through silicon vias (TSVs) 171 passes through the core silicon substrate 110 as an electrical connection between a top redistribution layer (RDL) 111 and a bottom redistribution layer (RDL) 112. The top RDL 111 is configured on a top surface of the silicon substrate 110, and a bottom RDL 112 is configured on a bottom surface of the silicon substrate 110. The plurality of first solder balls 141 are configured between the plurality of I/O pads and the top RDL 111 as an electrical connector there between.

A package substrate 12 is configured on a bottom side of the silicon interposer 11. The package substrate 12 has a core substrate 120 made of laminates and prepregs, a plurality of conductive through laminate vias (TLVs) 172 pass through the core substrate 120. A top RDL 121 is configured on a top side of the core substrate 120, and a bottom RDL 122 is configured on a bottom side of the core substrate 120. A plurality of second solder balls 142 are configured between the silicon interposer 11 and the package substrate 12 as an electrical connector there between. The TLVs 172 electrically couples the top RDL 121 and the bottom RDL 122.

A system board 13 is configured on a bottom of the package substrate 12. The system board 13 has a core substrate 130 made of laminates and prepregs, a plurality of conductive through laminate vias (TLVs) 173 passes through the core substrate 130. A top RDL 131 is configured on a top side of the core substrate 130 and a bottom RDL 132 is configured on a bottom side of the core substrate 130. A plurality of third solder balls 154 are configured between the package substrate 12 and the system board 13 as an electrical connector there between. The TLVs 173 electrically couples the top RDL 131 and the bottom RDL 132.

A first underfill 151 is filled into a space between chips 101, 102 and the silicon interposer 11. A second underfill 152 is filled into a space between silicon interposer 11 and the package substrate 12. A third underfill 153 is filled into a space between the package substrate 12 and the system board 13.

The prior art uses three plurality of solder balls 141, 142, 143 as the electrical connectors to join neighbored two electrical components of the system. The prior art further uses a silicon interposer 11 as an electrical connector between the chips 101, 102 and the package substrate 13. The prior art further uses a discrete system board 13. The prior art further more uses three underfill 151, 152, 153 for advancing the reliability between the interface of the neighbored two discrete electrical components. It is a bulky electronic system. In response to a demand for smaller, lighter and thinner consumer products, a new electronic system meeting the demand has been eager to develop.

BRIEF DESCRIPTION OF THE DRAWINGS

FIG. 2 shows a first embodiment according to the present invention.

DETAILED DESCRIPTION OF THE INVENTION

Figure 1:
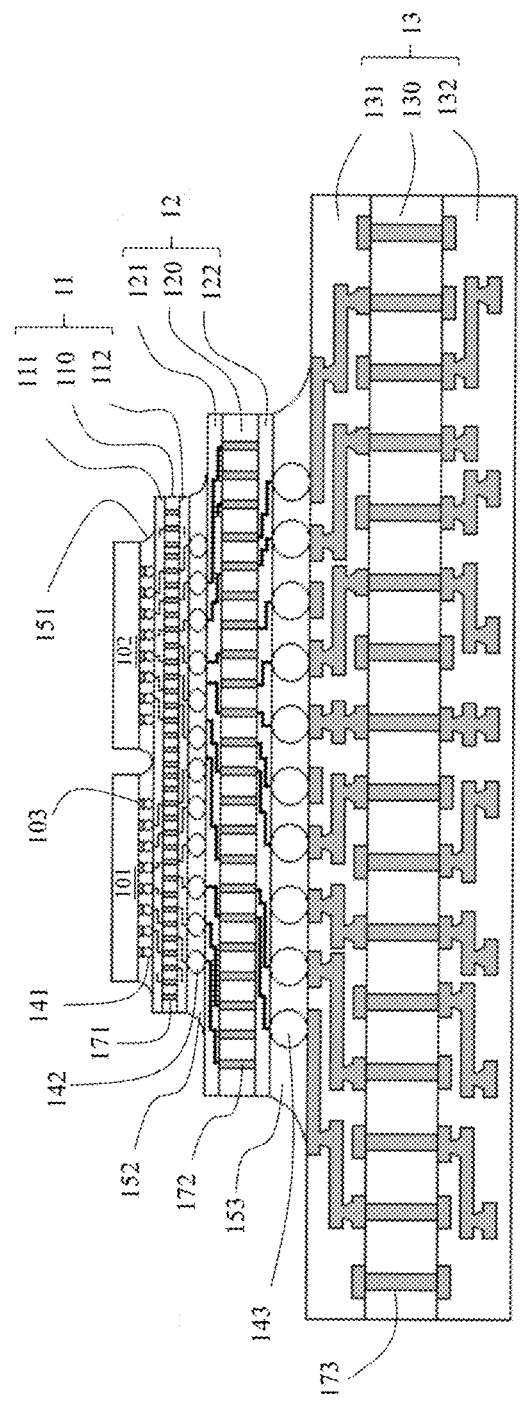
FIG. 1 shows a prior art.

A simplified structure and more reliable system in package (SiP) is developed according to the present invention. The disclosed system does without using solder balls, interposer, package, system board, and underfill. A first RDL 21 is built according to IC design to integrate the plurality of first solder balls 141 and the silicon interposer 11 of the prior art. A second RDL 22 is built according to PCB design rule to integrate the plurality of second solder balls 142, the package substrate 12, the plurality of third solder balls 143, and the system board 13 of the prior art. The present invention made the SiP an extremely thin package.

FIG. 2 shows a first embodiment according to the present invention.

FIG. 2 shows a system in package (SiP) which comprises chips 101, 102 configured on a top side of the package. Each of the chips 101, 102 has a plurality of I/O pads 103 configured on a bottom side of each chip; molding material 26 wraps the chips 101, 102 at least four lateral sides and a bottom side of the chips.

A first RDL 21 has a first redistribution circuitry 211 embedded in a first dielectric layer 212. The first redistribution circuitry 211, fabricated according to IC design rule, is configured on a bottom side of the molding material 26. A top end of the first redistribution circuitry 211 is electrically coupled to the I/O pads 103 of the chips through a plurality of first metal vias 215.

A second RDL 22 has a second redistribution circuitry 221 embedded in a second dielectric layer 222. The second redistribution circuitry 221, fabricated according to PCB design rule, is configured on a bottom side of the first redistribution circuitry 211. A top end of the second redistribution circuitry 221 is electrically coupled to the first redistribution circuitry 211 through a plurality of second metal vias 225.

Figure 3A:
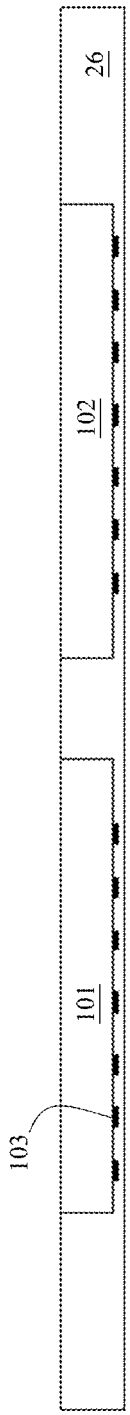
FIGS. 3A-3C show a fabricating process for the first embodiment according the present invention.
Figure 3B:
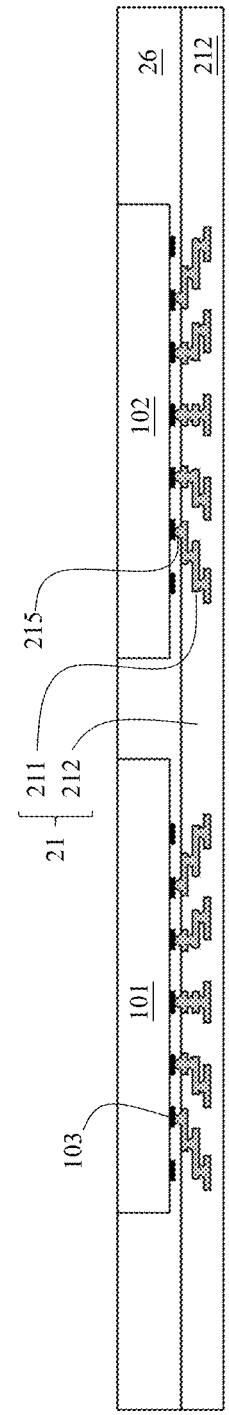
Figure 3C:
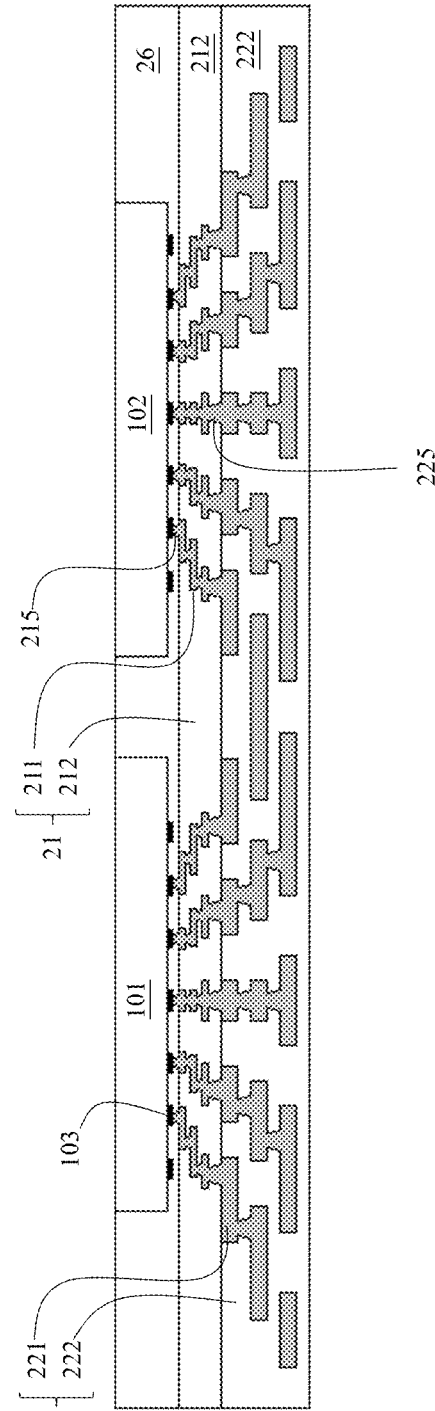

FIGS. 3A-3C show a fabricating process for the first embodiment according the present invention.

FIG. 3A shows: wrapping a plurality of chips 101, 102 with molding material 26; wherein a temporary carrier (not shown) configured on a top side of the chips 101, 102 is omitted to describe for simplification of the specification.

FIG. 3B shows: forming a first RDL 21 on a bottom surface of the molding material 26; the first RDL 21 has a first redistribution circuitry 211 embedded in a first dielectric layer 212.

FIG. 3C shows: forming a second RDL 22 on a bottom side of the first RDL 21. The second RDL 22 has a second redistribution circuitry 221 embedded in a second dielectric layer 222.

Figure 4:
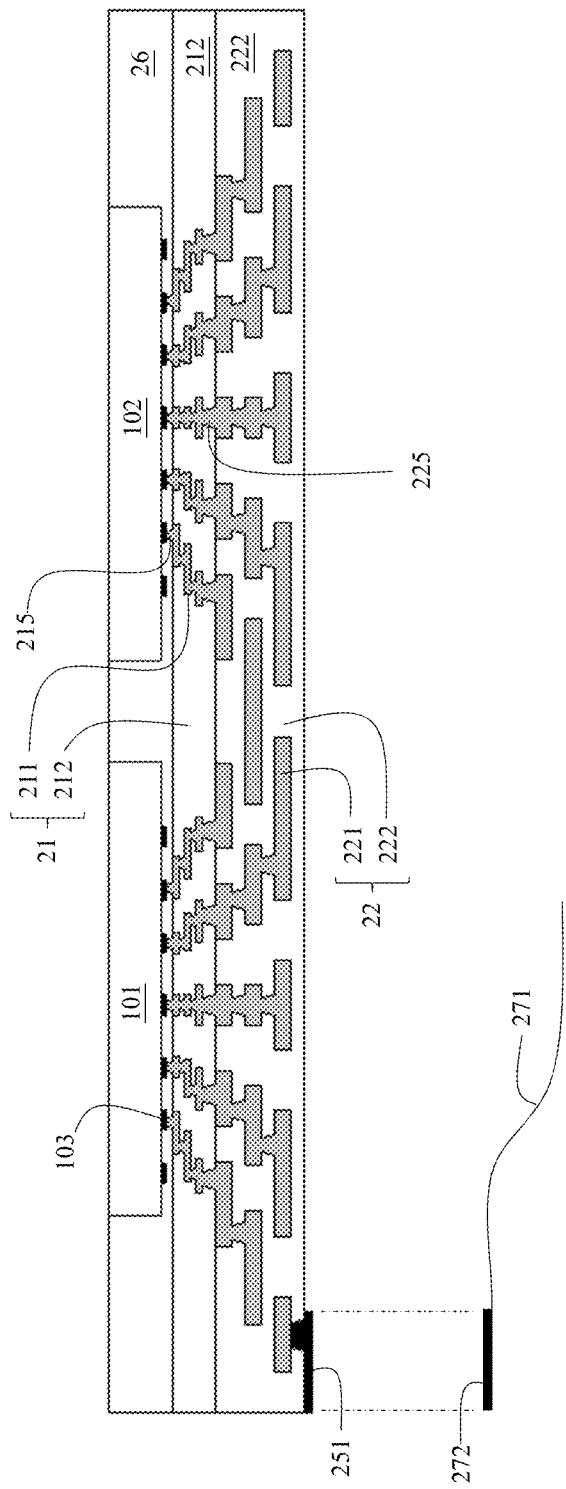
FIG. 4 shows a second embodiment according to the present invention.

FIG. 4 shows a second embodiment according to the present invention.

FIG. 4 shows a plurality of first gold fingers 251 formed on a bottom side of the second dielectric layer 222. The plurality of the first gold fingers 251 are electrically coupled to the second redistribution circuitry 221. The plurality of the first gold fingers 251 function as I/O contacts for the package system.

A flexible circuit board 271 can be prepared separately. A plurality of gold fingers 272 corresponding to the plurality of gold fingers 251 are formed on a left end of the flexible circuit board 271. A right end of the flexible circuit board 271 is electrically coupled to a power supply, additional electrical components, or a control system.

Figure 5:
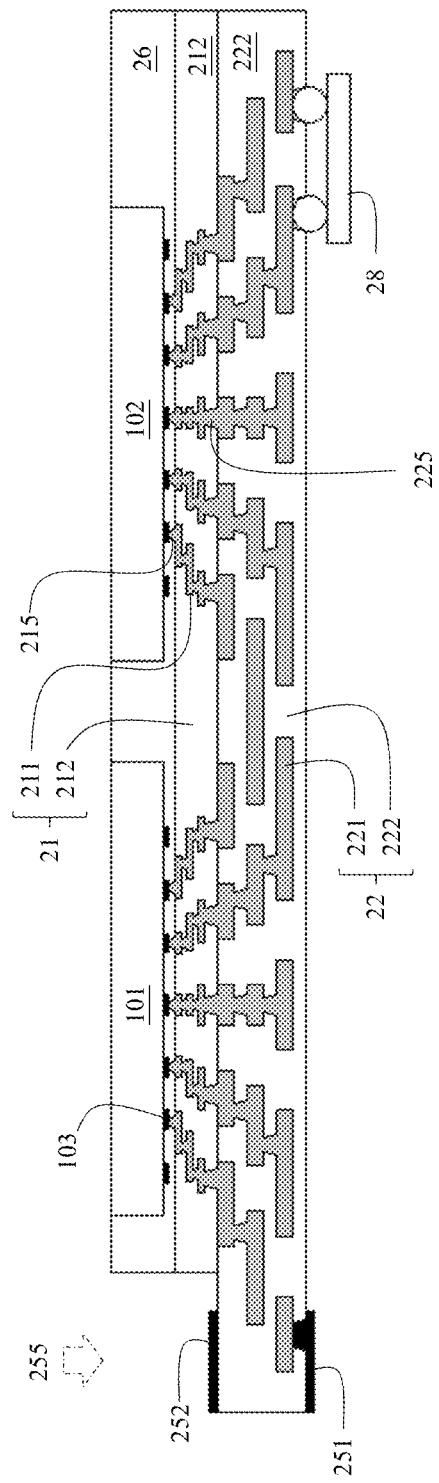
FIG. 5 shows a third embodiment according to the present invention.

FIG. 5 shows a third embodiment according to the present invention.

FIG. 5 shows the second RDL 22 is made wider than the first RDL 21 in the left side. FIG. 5 shows an extended area 255 is formed on a left side of the third RDL 22. A plurality of first gold fingers 251 are formed on a bottom side of the extended area 255. A plurality of second gold fingers 252 are formed on a top side of the extended area 255. The gold fingers 251, 252 are electrically coupled into a gold finger socket (not shown) or other connector (not shown) so that the package can be electrically coupled with additional electronic components. FIG. 5 further shows, at least one passive component 28 such as resistor, capacitor, inductor or other electronic components (not shown) can be optionally configured on a bottom side of the third RDL 23 and electrically coupled to the third redistribution circuitry 231.

While several embodiments have been described by way of example, it will be apparent to those skilled in the art that various modifications may be configured without departs from the spirit of the present invention. Such modifications are all within the scope of the present invention, as defined by the appended claims.

| Numerical system |
| --- |
| 101, 102 chip |
| 103 I/O pad |
| 11 interposer |
| 110 substrate |
| 111 top RDL |
| 112 bottom RDL |
| 12 package substrate |
| 121 top RDL |
| 122 bottom RDL |
| 13 system board |
| 131 top RDL |
| 132 bottom RDL |
| 141, 142, 143 solder ball |
| 151, 152, 152 underfill |
| 171 through silicon via, TSV |
| 172, 173 through laminate via, TLV |
| 21, 22 RDL |
| 211, 221 redistribution circuitry |
| 212, 222 dielectric layer |
| 215, 225 metal vias |
| 251, 252 gold fingers |
| 255 extended area |
| 26 molding material |
| 271 flexible circuit board |
| 272 gold fingers |
| 28 passive component |

What is claimed is:
1. A System in Package (SiP), comprising:
at least one chip having a plurality of input/output (I/O) pads;
a molding material wrapping the chip;
a first redistribution circuitry configured according to integrated circuit (IC) design rule and on a bottom of the molding material, the first redistribution circuitry electrically coupled to the plurality of I/O pads of the chip through a plurality of first metal vias;
a second redistribution circuitry configured according to printed circuit board (PCB) design rule and on a bottom of the first redistribution circuitry, the second redistribution circuitry electrically coupled to the first redistribution circuitry through a plurality of second metal vias;
a first dielectric layer embedding the first redistribution circuitry therein;
a second dielectric layer embedding the second redistribution circuitry therein; and
a plurality of first gold fingers configured on a bottommost surface of the second dielectric layer, the plurality of first gold fingers being exposed to an outside of the SiP to define I/O contacts for the SiP,
wherein
the molding material has a topmost surface coplanar with a topmost surface of the chip,
a topmost surface of the second dielectric layer is in direct contact with a bottommost surface of the first dielectric layer,
the second dielectric layer has an extended area extending beyond a side edge of the first dielectric layer, the plurality of first gold fingers being configured on the bottommost surface of the second dielectric layer and in the extended area of the second dielectric layer, and
the SiP further comprises:
a plurality of second gold fingers configured on the topmost surface of the second dielectric layer and in the extended area of the second dielectric layer, the plurality of second gold fingers being exposed to the outside of the SiP to define further I/O contacts for the SiP.
2. The SiP as claimed in claim 1, further comprising:
a flexible circuit board having a plurality of third gold fingers corresponding to the plurality of first gold fingers, and adapted to be electrically coupled to the plurality of the first gold fingers.
3. The SiP as claimed in claim 1, further comprising:
a plurality of openings configured on the bottommost surface of the second dielectric layer,
wherein each opening among the plurality of openings exposes a bottom surface of a corresponding bottom metal pad of a lowermost circuit layer of the second redistribution circuitry.
4. The SiP as claimed in claim 3, further comprising:
at least one passive element electrically coupled to the exposed bottom metal pads through the plurality of openings,
wherein the at least one passive element is completely below the bottommost surface of the second dielectric layer.
5. The SiP as claimed in claim 1, wherein
in a thickness direction of the SiP, the first redistribution circuitry is between the molding material and the second redistribution circuitry,
in the thickness direction of the SiP, the plurality of first gold fingers overlap the plurality of second gold fingers, in the thickness direction, the plurality of first gold fingers and the plurality of second gold fingers do not overlap the first redistribution circuitry, the chip and the molding material, and the plurality of first gold fingers and the plurality of second gold fingers are configured to be electrically coupled into a gold finger socket to electrically couple the SiP with an additional electronic component.

6. The SiP as claimed in claim 5, further comprising:

at least one passive element; and a plurality of openings configured on the bottommost surface of the second dielectric layer, wherein each opening among the plurality of openings exposes a bottom surface of a corresponding bottom metal pad of a lowermost circuit layer of the second redistribution circuitry, the at least one passive element is electrically coupled to the exposed bottom metal pads through the plurality of openings, and the at least one passive element is completely below the bottommost surface of the second dielectric layer.

7. The SiP as claimed in claim 6, wherein the at least one passive element includes at least one of a resistor, a capacitor, and an inductor.

8. A System in Package (SiP), comprising:

at least one chip having a plurality of input/output (I/O) pads;

a molding material wrapping the chip;

a first redistribution circuitry fabricated according to integrated circuit (IC) design rule, and configured on a bottom of the molding material, the first redistribution circuitry electrically coupled to the plurality of PO pads of the chip through a plurality of first metal vias; and a second redistribution circuitry fabricated according to printed circuit board (PCB) design rule, and configured on a bottom of the first redistribution circuitry, the second redistribution circuitry electrically coupled to the first redistribution circuitry through a plurality of second metal vias, wherein the SiP is free of solder balls, an interposer, a package substrate, a system board, and underfill.

9. The SiP as claimed in claim 8, further comprising:

a first dielectric layer embedding the first redistribution circuitry therein; and a second dielectric layer embedding the second redistribution circuitry therein, wherein a topmost surface of the second dielectric layer is in direct contact with a bottommost surface of the first dielectric layer.

10. The SiP as claimed in claim 9, wherein each of the plurality of first metal vias includes a metal plated in a corresponding hole in the molding material.

11. The SiP as claimed in claim 10, wherein each of the plurality of second metal vias includes a metal plated in a corresponding hole in the first dielectric layer.

12. The SiP as claimed in claim 9, further comprising:

a plurality of first gold fingers configured on a bottommost surface of the second dielectric layer, the plurality of first gold fingers being exposed to an outside of the SiP to define I/O contacts for the SiP.

13. The SiP as claimed in claim 9, wherein the molding material wraps four side surfaces and a bottommost surface of the chip, but leaves a topmost surface of the chip exposed to an outside of the SiP.

* * * * *